United States Patent
Simons et al.

(10) Patent No.: US 9,334,564 B2
(45) Date of Patent: May 10, 2016

(54) TUBE-SHAPED SPUTTERING TARGET

(75) Inventors: Christoph Simons, Biebergemünd (DE); Martin Schlott, Offenbach (DE); Josef Heindel, Hainburg (DE); Christoph Stahr, Kahl Am Main (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 948 days.

(21) Appl. No.: 13/365,365

(22) Filed: Feb. 3, 2012

(65) Prior Publication Data
US 2012/0213917 A1 Aug. 23, 2012

(30) Foreign Application Priority Data
Feb. 22, 2011 (DE) .......................... 10 2011 012 034

(51) Int. Cl.
*C23C 14/34* (2006.01)
*C22C 28/00* (2006.01)
*H01J 37/34* (2006.01)

(52) U.S. Cl.
CPC ............. *C23C 14/3414* (2013.01); *C22C 28/00* (2013.01); *C23C 14/3407* (2013.01); *H01J 37/342* (2013.01); *H01J 37/3426* (2013.01); *Y02E 10/541* (2013.01); *Y10T 428/12396* (2015.01)

(58) Field of Classification Search
CPC .............................. H01J 37/3426; C22C 28/00
See application file for complete search history.

(56) References Cited

U.S. PATENT DOCUMENTS

| | | | |
|---|---|---|---|
| 6,719,034 B2 | 4/2004 | Heck et al. | |
| 7,717,987 B2 | 5/2010 | van Osten et al. | |
| 2003/0089482 A1 | 5/2003 | Heck et al. | |
| 2004/0063320 A1 | 4/2004 | Hollars | |
| 2005/0118339 A1 | 6/2005 | De Bosscher et al. | |
| 2005/0279630 A1* | 12/2005 | Fonte ....................... | 204/298.21 |
| 2008/0271779 A1* | 11/2008 | Miller et al. .................. | 136/252 |
| 2010/0129660 A1* | 5/2010 | Nakayama et al. ........... | 428/412 |
| 2010/0310783 A1 | 12/2010 | Juliano et al. | |
| 2013/0153414 A1 | 6/2013 | Endo et al. | |

FOREIGN PATENT DOCUMENTS

| | | |
|---|---|---|
| CN | 1196806 C | 4/2005 |
| CN | 101801565 A | 8/2010 |
| DE | 4115663 A1 | 11/1992 |
| DE | 10063383 C1 | 3/2002 |
| DE | 102006055662 B3 | 6/2008 |
| EP | 0801145 A1 | 10/1997 |
| EP | 1591556 A1 | 11/2005 |

(Continued)

OTHER PUBLICATIONS

English translation of an Office Action issued Dec. 2, 2013 in KR Application No. 10-2012-0016571.

(Continued)

*Primary Examiner* — Jason M Berman
(74) *Attorney, Agent, or Firm* — Panitch Schwarze Belisario & Nadel LLP

(57) ABSTRACT

A tube-shaped sputtering target is provided having a carrier tube and an indium-based sputtering material arranged on the carrier tube. The sputtering material has a microstructure having a mean grain size of less than 1 mm, measured as the mean diameter of the grains on the sputtering-roughened surface of the sputtering material.

25 Claims, 2 Drawing Sheets

(56) References Cited

FOREIGN PATENT DOCUMENTS

| | | |
|---|---|---|
| EP | 2216424 A1 | 8/2010 |
| EP | 2233604 A1 | 9/2010 |
| EP | 1186682 B1 | 11/2010 |
| EP | 2287356 A1 | 2/2011 |
| JP | 60-234968 A | 11/1985 |
| JP | H05-171428 A | 7/1993 |
| JP | 06-264233 A | 9/1994 |
| JP | 08-218164 A | 8/1996 |
| JP | H08-253858 A | 10/1996 |
| JP | 10-068072 A | 3/1998 |
| JP | 10-130827 A | 5/1998 |
| JP | 10-195609 A | 7/1998 |
| JP | 10-237630 A | 9/1998 |
| JP | 11-269637 A | 10/1999 |
| JP | 2003-017491 A | 1/2003 |
| JP | 3462927 B2 | 11/2003 |
| JP | 2004-162117 A | 6/2004 |
| JP | 2004-538371 A | 12/2004 |
| JP | 2006-299412 A | 11/2006 |
| JP | 2009-120862 A | 6/2009 |
| JP | 2009-120863 A | 6/2009 |
| JP | 2010-526211 A | 7/2010 |
| JP | 2011-098855 A | 5/2011 |
| JP | 2012-052190 A | 3/2012 |
| JP | 2012-052193 A | 3/2012 |
| WO | 2008081585 A1 | 7/2008 |
| WO | 2010051351 A2 | 5/2010 |

OTHER PUBLICATIONS

English translation of an Office Action issued Dec. 23, 2013 in CN Applicaiton No. 201210041442.1.
English translation of an Office Action issued Feb. 12, 2014 in JP Application No. 2012-036109.
English translation of Observations by a Third Party, submitted Apr. 17, 2013 in JP Application No. 2012-036109.
EP Search Report issued May 30, 2012 in EP Application No. 12000166.4.
English translation of an Office Action issued Dec. 8, 2014 in JP Application No. 2012-036109.
English translation of an Office Action issued Oct. 15, 2013 in JP Application No. 2012-036109.
Office Action issued Sep. 9, 2011 in DE Application No. 102011012034.3.
"Thin Film Materials," Heraeus, No. 11 (Apr. 2008).
Office Action and Search Report issued Jul. 1, 2015 in TW Application No. 101103803.

* cited by examiner

TUBE-SHAPED SPUTTERING TARGET

BACKGROUND OF THE INVENTION

The invention relates to a tube-shaped sputtering target having a carrier tube and an indium-based sputtering material arranged on the carrier tube.

Indium tube targets are used, for example, for coating CuInGa absorber layers for thin layer photovoltaic cells based on $CuInGaS_2$ or $CuInGaSe_2$ (also referred to as "CIGS"). Indium sputtering is often associated with the formation of needle-shaped structures on the surface of the sputtering target, which lead to different sputtering rates and thus uneven thickness of layers as a function of grain orientation (M. Weigert, "The Challenge of CIGS Sputtering," Heraeus *Thin Film Materials* magazine, No. 11, April 2008).

Thus far, the corresponding tube targets have been produced by a simple casting process, as is described, for example, in European Patent EP 1 186 682 B1. Owing to the metal needing to be very pure (99.99 to 99.999%) for the CIGS application, the sputtering targets have a very coarse structure, which may then lead to the problems mentioned above.

BRIEF SUMMARY OF THE INVENTION

It is an object of the invention to improve the known sputtering targets, in order to attain even sputtering rates and evenly thick layers.

The invention is characterized, in particular, by a tube-shaped sputtering target having a carrier tube and an indium-based sputtering material arranged on the carrier tube, wherein the sputtering material has a microstructure having a mean grain size of less than 1 mm, measured as the mean diameter of the grains on the sputtering-roughened surface of the sputtering material. The sputtering material comprises, in particular, a copper and/or gallium fraction of at most 1% by weight.

As an option, the sputtering material can contain at least one metal from the group of tin and zinc. Moreover, it is expedient for the mean grain size of the microstructure to be less than 500 μm, preferably less than 200 μm. Further, it is advantageous for the liquidus temperature of the sputtering material to be no higher than 350° C.

Moreover, it is advantageous for the mean grain size of the sputtering material to be established across its thickness as measured radially from the target surface to at least 1 mm above the carrier tube. In this context and with regard to corresponding specified measurements presented hereinafter, the distance of at least 1 mm refers to the distance measured from the external surface of the carrier tube or, if applicable, from the external surface of a layer (for example adhesion promoter, solder layer) that is arranged between the carrier tube and sputtering material, wherein the distance is to be measured in a radial direction outward.

Preferably, the purity of the metal of the sputtering material is at least 99.99%, more preferably 99.999%. In another advantageous embodiment, the sputtering material comprises a homogeneous microstructure, at least at a distance of more than 1 mm from the surface of the carrier tube facing the sputtering material.

It is expedient that at least 90% of the grains of the sputtering material are of a size in a range of +/−70%, preferably +/−50% of the mean grain size. In particular, it is advantageous that the grains of the microstructure of the sputtering material each have a smallest and a largest diameter, wherein the ratio of largest to smallest diameter of the majority of the grains is greater than 1.5, preferably greater than 2, in particular greater than 3. In this context, it is reasonable that at least the majority of the grains have a shape that deviates from spherical shape. In this context, the shape can be that of a sphere that is flattened or crimped in one or more directions or deformed in any other way.

Advantageously, the density of the sputtering material is at least 90%, in particular at least 95%, of the theoretical density. Moreover, it is expedient that the individual grains of the sputtering material are passivated on the surface by an oxide layer. Preferably, the oxygen content of the sputtering material can be in the range of 50 to 500 ppm, more preferably in the range of 70 to 300 ppm, based on the entire sputtering material.

The carrier tube can be made of a non-magnetic material, preferably from a non-magnetic steel alloy. When the material of the carrier tube is a non-magnetic steel alloy, the iron content of the sputtering material is no more than 5 ppm, preferably no more than 1 ppm, higher than the iron content of the starting material of the sputtering material, measured at a minimal distance of 1 mm from the carrier tube or from a layer of adhesion promoter, which may possibly be arranged between sputtering material and carrier tube.

The length of the sputtering target can preferably be at least 500 mm.

According to an embodiment of the invention, the sputtering target can be used for deposition of layers of photovoltaic absorber, either directly or in a multi-step process or for deposition of oxidic layers by reactive sputtering.

In general, the invention can provide a highly pure tube target (degree of purity of 99.99 to 99.999%) made of indium (In) or an In alloy having a fine grain size and high density. Moreover, the oxygen content can be selected such that, on the one hand, there is no spark-over at the cathode (arcing) or needle formation or pick-up during the sputtering, and on the other hand, that the target material does not immediately melt over much of its area in case arcing occurs anyway. A good ratio of starting material to usable target material can thus be obtained.

The sputtering target material according to embodiments of the invention can therefore preferably comprise one or more of the following features:

purity of at least 99.99%, preferably at least 99.999%;

fine-grained microstructure of sputtering material having a mean grain size of less than 1 mm, preferably of less than 500 μm, more preferably of less than 200 μm, as measured from the mean diameter of the indium grains on the sputtering-etched tube surface, wherein the grain size is established from the target surface to 1 mm above the carrier tube;

homogeneous microstructure along the length and thickness of the target (except for the last 1 mm closest to the carrier tube) with the grain size of 90% of the grains being in a range of +/−70%, preferably +/−50%, of the mean grain size;

grain shape having a lens-shaped cross-section having a diameter/thickness ratio of greater than 2;

density greater of at least 90%, preferably at least 95% of the theoretical density;

surface passivation of the individual grains by a thin oxide layer, in order to reduce the melting tendency in case arcing occurs;

oxygen content in the range of 50 to 500 ppm, preferably in the range of 70 to 300 ppm;

composition: indium (including impurities), indium alloys having a melting temperature below 300° C., in particular In:Sn; and composite of indium material and a stainless steel carrier tube, wherein the iron content of the sputtering target material is not increased by more than 5 ppm/1 ppm as compared to the iron content of the starting material used to produce it.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The invention is described below based on methods for preparing tubular targets according to the present invention and according to the prior art.

1. Method for producing a tubular target according to the invention:

Highly pure indium (99.999%) was melted in a crucible. A carrier tube provided with a rough layer of adhesion promoter was mounted on a rotary device. The liquid melted indium metal was supplied by a feed line to an atomizer nozzle where it was sprayed by the action of a gas. The liquid melted drops hit the rotating carrier tube, and a relative motion of carrier tube versus spray nozzle thus caused thick metallic indium layer to be deposited in the form of multiple layers on the carrier tube over time.

The optimal temperature of the melt must be determined in some preliminary experiments as a function of nozzle geometry, spraying distance, and circumferential speed of the carrier tube. Temperatures in the range of 170-230° C. have proven to be beneficial.

Protective gases such as argon and nitrogen as well as air are conceivable as atomizer gas. Suitable selection of the gas in combination with melting temperature and spraying distance allows the effective oxygen content to be adjusted in the sputtering target material. This also requires some preliminary experiments depending on the solution that is selected.

The tube blank thus produced still has a rough surface from spraying, which was removed by over-twisting. This resulted in a microstructure according to the invention provided the production parameters were selected appropriately. This is easy to achieve for a person skilled in the art by a small series of experiments, wherein particular attention must be directed to temperature and atmosphere in order to attain the grain size and oxygen content properties according to the invention.

When the coating parameters were selected inappropriately, the resulting density was too low (less than 90%) or the oxygen content was too high (in excess of 500 ppm).

Figure 1A:
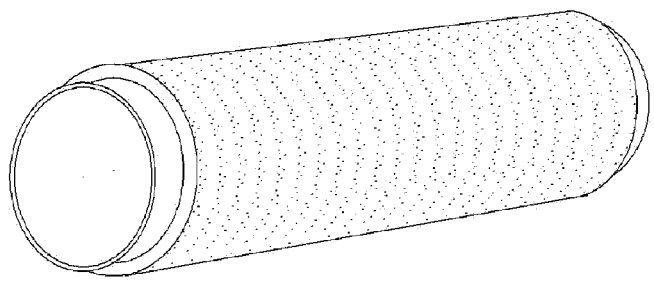
FIG. 1a is a schematic perspective view showing a fine-grained target prepared according to method 1 having a microstructure according to an embodiment of the invention.
Figure 1B:
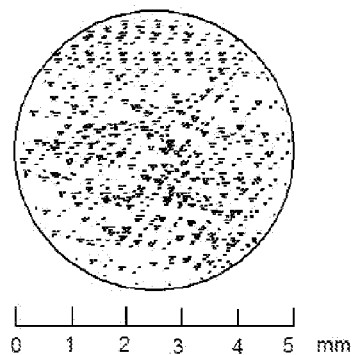
FIG. 1b is an enlarged representation showing a sputtering-etched surface of an In tube target according to method 1.

The tubes thus produced had a fine-grained microstructure having a mean grain size of 50 to 500 µm depending on the process parameters. In most cases, the resulting mean grain sizes were less than 200 µm. The grain size was less than 1 mm (FIGS. 1a, 1b) in each case. Owing to the production of the sputtering target according to the invention in the form of layers, the microstructure is homogeneous across the thickness and jacket surface of the sputtering target. The mean grain size varied in length and thickness across the sputtering target by no more than +/−70%, but in most cases only by less than +/−50%. Moreover, the grains had a flattened shape having a ratio of diameter to thickness usually in the range in excess of 2, frequently in excess of 3.

Figure 2:
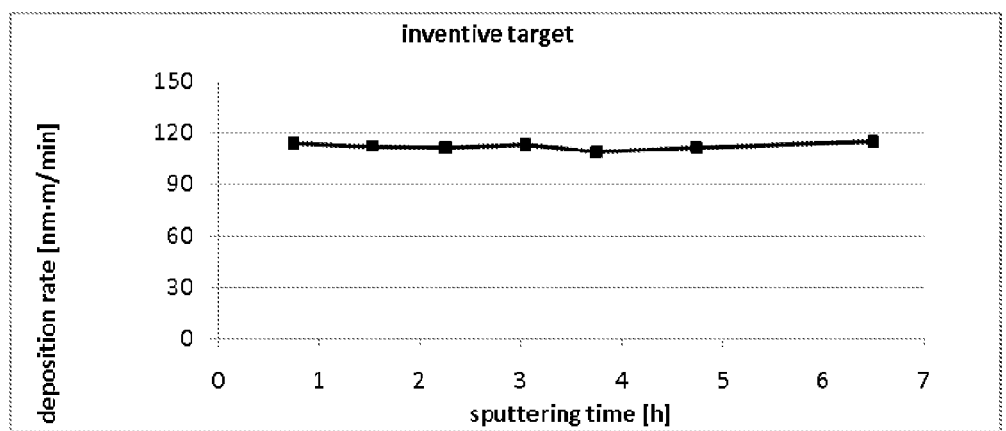
FIG. 2 is a graph showing the sputtering rate as a function of time for a target according to an embodiment of the invention at a specific power of 4 kW/m.

Owing to the fine and homogeneous grain size and the flat grain shape, the exposure time of each grain during sputtering until removal of the grain was but short. As a consequence, the needle structure described above cannot be established over large areas. Therefore the resulting sputtering rates (deposition rates) were very stable (see FIG. 2). In favorable embodiments, it was feasible to implement specific sputtering loads of up to approx. 20 kW/m, even for tubular targets having an indium coating having a thickness of 15 mm. The sputtering target can therefore be operated with a specific power of at least 15 kW/m, possibly even 20 kW/m or more.

Suitable selection of the process conditions allowed oxygen values in the range of 50 to 500 ppm to be attained. It has surprisingly been found that specifically triggered arcing during sputtering generates traces in the low melting indium that are the deeper the lower the oxygen content is. The oxide shell around the grains therefore leads to stabilization of the surface of the sputtering target during a brief time of melting. Advantageous oxygen contents have been found to be in the range of 70 to 300 ppm. The range of 50 to 500 ppm can be used as well, although with certain limitations. It is important in this context that the oxygen be present in the form of an oxide shell around the particles and/or grains. The beneficial effect of melt stabilization no longer occurs if the $O_2$ values are too low. If the $O_2$ values are too high, instabilities caused by the oxides are evident and then lead to undesirable arcing.

The iron content of targets produced as described was less than 1 ppm, provided the sample was taken at least 1 mm above the carrier tube and/or adhesive layer arranged between the carrier tube and the sputtering material. The impurities were assayed on acid-dissolved sputtering target material using optical emission spectrometry (OES) and excitation by inductively coupled plasma (ICP).

Alternatively, it is feasible to use indium alloys as, for example, In:Cu, In:Ga, In:Sn, In:Zn, or mixtures thereof, rather than pure indium. The method according to the invention worked successfully provided the liquidus temperatures of the alloys did not exceed 350° C. Due to the eutectic mixture being fairly low, it makes sense to use In:Ga only as an additive of up to maximally 5 to 10% by weight. The use of In:Cu is limited to maximally approx. 5% by weight, since the liquidus temperature rises rapidly.

2. Alternative method for producing tubular target (reference example):

The casting production procedure of the reference example corresponded to the method described for Sn tubes in EP 1 186 682 B1, except that 99.999% pure indium was used. The indium was melted and cast at 190° C. from a crucible into a pre-heated steel mold surrounding the carrier tube, wherein the foot part of the steel mold was connected to the carrier tube by a sealing part. Moreover, the casting mold had been rinsed with protective gas in order to prevent oxidation. To improve the bonding of the indium to the carrier tube, the carrier tube was provided with a nickel-based adhesive layer, which had been provided with indium solder earlier. After casting, the carrier tube was cooled from inside commencing on the foot part using blown-in air, such that the resulting solidification proceeded from bottom to top.

Figure 3:
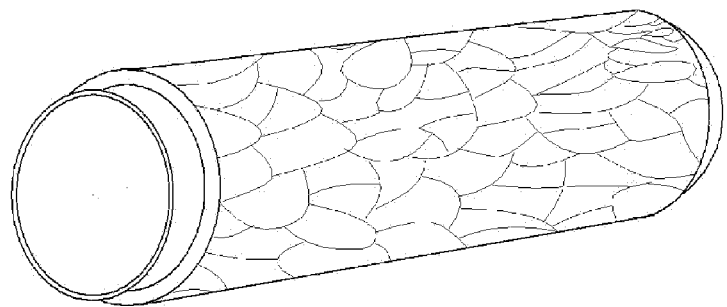
FIG. 3 is a schematic perspective view showing a sputtering target prepared according to method 2 (reference target) having a coarse-grained microstructure.
Figure 4:
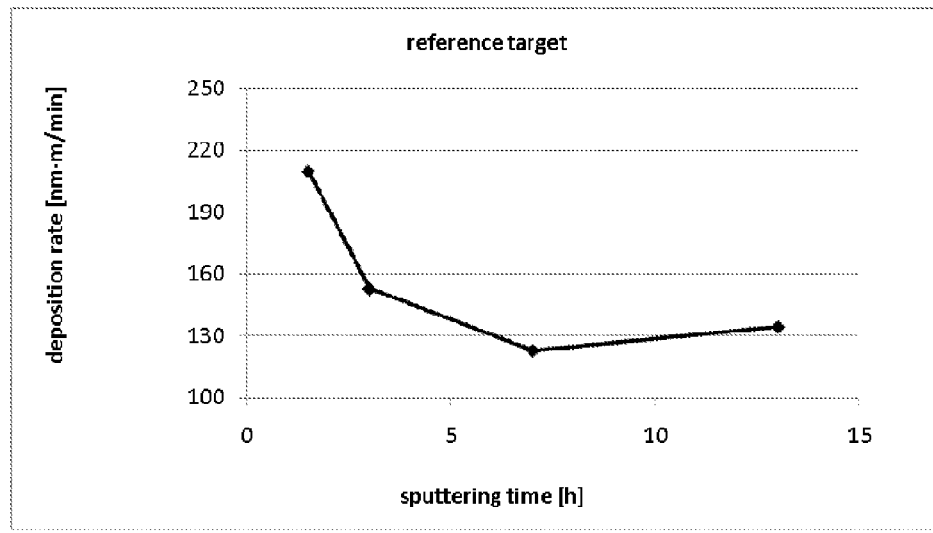
FIG. 4 is a graph showing the sputtering rate as a function of time for a target according to method 2 (reference target) at a specific power of 4 kW/m.

The method resulted in a coarse-grained indium tubular target (FIG. 3), wherein the resulting iron content of 50 ppm was too high as well, since the melt contacted the carrier tube and the casting mold for a long period of time. The coarse microstructure resulted in the strong decrease of the sputtering rate over time as shown in FIG. 4, since the needle structure mentioned above formed on the surface. The sputtering target sputtered with no more than negligible arcing. However, the low oxygen content of less than 50 ppm gave rise to artificially generated arcing producing deep holes in the target surface. Since the sputtering process on a large technical scale is periodically associated with external reasons for arcing, this fact is an increased risk, especially in the case of a material melting as low as indium.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A tube-shaped sputtering target comprising a carrier tube and an indium-based sputtering material arranged on the carrier tube, wherein the sputtering material has a microstructure having a mean grain size of less than 1 mm, measured as a mean diameter of grains on a sputtering-roughened surface of the sputtering material, wherein the sputtering material comprises a copper and/or gallium fraction of at most 1% by weight, and wherein the sputtering material has a homogeneous microstructure at least at a distance of more than 1 mm from a surface of the carrier tube facing the sputtering material.

2. The sputtering target according to claim 1, wherein the sputtering material contains at least one metal from the group of tin and zinc.

3. The sputtering target according to claim 1, wherein the microstructure has a mean grain size of less than 500 µm.

4. The sputtering target according to claim 1, wherein the microstructure has a mean grain size of less than 200 µm.

5. The sputtering target according to claim 1, wherein the sputtering material has a liquidus temperature of no more than 350° C.

6. The sputtering target according to claim 1, wherein the mean grain size of the sputtering material is established over its thickness measured radially from a target surface to at least 1 mm over the carrier tube.

7. The sputtering target according to claim 1, wherein the sputtering material consists of a metal having a purity of at least 99.99%.

8. The sputtering target according to claim 1, wherein the sputtering material consists of a metal having a purity of at least 99.999%.

9. The sputtering target according to claim 1, wherein at least 90% of the grains are of a size in a range of +/−70% around the mean grain size.

10. The sputtering target according to claim 1, wherein at least 90% of the grains are of a size in a range +/−50% around the mean grain size.

11. The sputtering target according to claim 1, wherein the grains of the microstructure of the sputtering material each have a smallest and a largest diameter, and wherein a ratio of largest to smallest diameter of a majority of the grains is greater than 1.5.

12. The sputtering target according to claim 11, wherein at least the majority of the grains has a shape that deviates from spherical shape.

13. The sputtering target according to claim 1, wherein the grains of the microstructure of the sputtering material each have a smallest and a largest diameter, and wherein a ratio of largest to smallest diameter of a majority of the grains is greater than 2.

14. The sputtering target according to claim 1, wherein the grains of the microstructure of the sputtering material each have a smallest and a largest diameter, and wherein a ratio of largest to smallest diameter of a majority of the grains is greater than 3.

15. The sputtering target according to claim 1, wherein a density of the sputtering material is at least 90% of theoretical density.

16. The sputtering target according to claim 1, wherein a density of the sputtering material is at least 95% of the theoretical density.

17. The sputtering target according to claim 1, wherein individual grains of the sputtering material are passivated on their surface by an oxide layer.

18. The sputtering target according to claim 1, wherein oxygen content of the sputtering material is in a range of 50 to 500 ppm, based on the entire sputtering material.

19. The sputtering target according to claim 1, wherein oxygen content of the sputtering material is in a range of 70 to 300 ppm, based on the entire sputtering material.

20. The sputtering target according to claim 1, wherein the carrier tube is made of a non-magnetic material.

21. The sputtering target according to claim 20, wherein the carrier tube is made of a non-magnetic steel alloy, and an iron content of the sputtering material is no more than 5 ppm higher than an iron content of a starting material for the sputtering material, measured at a minimal distance of 1 mm from the carrier tube or from a layer of adhesion promoter optionally arranged between the sputtering material and the carrier tube.

22. The sputtering target according to claim 20, wherein the carrier tube is made of a non-magnetic steel alloy, and an iron content of the sputtering material is no more than 1 ppm higher than an iron content of a starting material for the sputtering material, measured at a minimal distance of 1 mm from the carrier tube or from a layer of adhesion promoter optionally arranged between the sputtering material and the carrier tube.

23. The sputtering target according to claim 1, wherein the sputtering target has a length of at least 500 mm.

24. A method for producing a photovoltaic absorber, the method comprising depositing layers of absorber material on a photovoltaic cell, either directly or in a multi-step process, by sputtering the sputtering target according to claim 1.

25. A method for deposition of oxidic layers, the method comprising reactive sputtering of the sputtering target according to claim 1.

* * * * *